(12) United States Patent
Linam (10) Patent No.: US 8,279,697 B2
(45) Date of Patent: Oct. 2, 2012

(54) CIRCUITS AND METHODS FOR REDUCING NOISE IN THE POWER SUPPLY OF CIRCUITS COUPLED TO A BIDIRECTIONAL BUS

(75) Inventor: David Linam, Fort Collins, CO (US)

(73) Assignee: Avago Technologies Enterprise IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 13/281,303

(22) Filed: Oct. 25, 2011

(65) Prior Publication Data

US 2012/0039136 A1 Feb. 16, 2012

Related U.S. Application Data

(63) Continuation-in-part of application No. 12/557,658, filed on Sep. 11, 2009.

(51) Int. Cl.
*G11C 7/02* (2006.01)
(52) U.S. Cl. ........................................ 365/206
(58) Field of Classification Search .................. 365/206
See application file for complete search history.

(56) References Cited

U.S. PATENT DOCUMENTS

| | | |
|---|---|---|
| 6,615,345 B1 | 9/2003 | LaBerge |
| 6,707,756 B2 | 3/2004 | Amidi |
| 6,807,650 B2 | 10/2004 | Lamb et al. |
| 7,164,292 B2 | 1/2007 | Schmitt et al. |
| 7,170,818 B2 | 1/2007 | Kyung |
| 7,292,500 B2 * | 11/2007 | Liu et al. ................... 365/233.1 |
| 7,558,132 B2 | 7/2009 | Carnevale et al. |
| 7,587,547 B2 | 9/2009 | Teh et al. |
| 7,590,879 B1 | 9/2009 | Kim et al. |
| 7,739,538 B2 | 6/2010 | Fee et al. |
| 2002/0017920 A1 * | 2/2002 | Bridgewater, Jr. ............... 326/82 |
| 2002/0188820 A1 * | 12/2002 | Taruki ............................ 711/218 |
| 2006/0203602 A1 * | 9/2006 | Best et al. ..................... 365/233 |
| 2008/0036521 A1 | 2/2008 | Kogishi et al. |
| 2008/0094918 A1 | 4/2008 | Fujizoe |
| 2008/0181047 A1 | 7/2008 | Haraguchi et al. |
| 2008/0195719 A1 | 8/2008 | Wu et al. |
| 2008/0242255 A1 * | 10/2008 | Tamura ......................... 455/334 |
| 2008/0304332 A1 | 12/2008 | Wang |
| 2009/0021998 A1 | 1/2009 | Millar et al. |
| 2009/0072856 A1 | 3/2009 | Subramaniam et al. |
| 2010/0135370 A1 | 6/2010 | Best |
| 2011/0019760 A1 | 1/2011 | Nguyen |
| 2011/0043220 A1 | 2/2011 | Leibowitz et al. |

OTHER PUBLICATIONS

Povazanec, J. et al., On Design of Low-Noise Adaptive Output Drivers, IEEE Transactions on Circuits and Systems-I: Fundamental Theory and Applications, vol. 46, No. 12, Dec. 1999, pp. 1487-1491.

* cited by examiner

*Primary Examiner* — Chun-Kuan Lee
*Assistant Examiner* — Ronald Modo (57) ABSTRACT

Circuits and methods for reducing noise in the power supply of circuits coupled to a bidirectional bus are presented. The circuits and methods are responsive to an idle condition on the bidirectional bus. The control signal is applied to and changes an electrical characteristic within the receiver to generate a voltage offset. The voltage offset prevents unintended voltage transitions in the power supply of circuits coupled to the bidirectional bus from generating a signal transition on an output signal connection of the receiver.

16 Claims, 9 Drawing Sheets

CIRCUITS AND METHODS FOR REDUCING NOISE IN THE POWER SUPPLY OF CIRCUITS COUPLED TO A BIDIRECTIONAL BUS

CROSS-REFERENCE TO RELATED APPLICATIONS

This application is a continuation-in-part patent application of and claims priority to U.S. Utility patent application Ser. No. 12/557,658, entitled "Interfaces, Circuits, and Methods for Communicating With a Double Data Rate Memory Device" (First Named Inventor: David Linam), filed Sep. 11, 2009, which is hereby incorporated by reference in its entirety.

BACKGROUND

As computers and computer processors increase in performance, memory access performance becomes a significant factor affecting overall system performance. If an interface that communicates data between a memory device and a memory controller or other application device operates slower than a processor can use data, the interface can reduce the data processing capacity of the entire computer.

For dynamic random access memory (DRAM) devices, which are commonly used as the main working memory for a computer, various interconnect technologies have been developed over the years. One such interconnect technology is used for synchronous DRAMs, or SDRAMs, which utilize a source synchronous interface, where the source of data during a memory transfer is relied upon to provide a clock signal, often referred to as a data strobe signal (DQS), that is used by a target for the data to capture such data as it is being transferred over a data line to the target. In particular, the capture of data on a data line is typically latched by the rising or falling edge of the DQS signals, for example, so that the value transmitted on a data line when the data strobe signal transitions from low to high, or visa-versa, will be latched into a data latch in the target.

Double data rate (DDR) memory elements contain multiple buses. A command and address bus is formed by a number of signals, such as, for example, a column-address strobe (CAS), row-address strobe (RAS), write enable (WE), clock enable (CKE), chip-select (CS), address (ADDR), bank address (BA) signals, and differential clock signals (CK and CKn). The data bus contains the data signals (DQ), data mask (DM) and the source synchronous strobes (DQS and DQSN). DDR3 memory elements operate with differential strobes DQS and DQSN, which enable source-synchronous data capture at twice the clock frequency. Data is registered with the rising edge of DQS and DQSN signals.

DDR3 data is transferred in bursts for both read and write operations, sending or receiving 2, 4 or 8 data words with each memory access. For read operations, data bursts of various lengths are transmitted by the DRAM device edge aligned with a strobe. For write operations, data bursts of various lengths are received by the DRAM element with a 90 degree phase-delayed strobe. The strobe signal is a bidirectional signal used to capture data. After the data is captured in the source-synchronous strobe domain, the data must be transferred into a local clock domain.

During a read operation, a host or receiving device issues a read command and communicates a clock signal to the source DRAM. After a DRAM internal delay, the DRAM returns a data signal and strobe clock signal to the host. The host uses the strobe clock signal to capture the data signal. The data signal is captured in the source-synchronous strobe domain and must be transferred into the local clock domain. The DRAM transmits a preamble on the strobe signals at the beginning of each read data burst. The preamble places the positive-true and negative-true strobe signals in a differential state to ensure that the differential strobe receiver outputs are in a valid state in preparation for the first strobe edge. The host may use the preamble period as a window in which to gate, or "unpark" the strobe receiver outputs.

However, before a preamble signal arrives at the strobe pins, i.e., when the bidirectional bus is not transferring data to the receiver, the differential inputs on the strobe receivers are driven to a termination voltage or $V_{TT}$, which is ½ of $V_{DD}$ for DDR3 signals. When both inputs of a differential receiver are driven to the same voltage level, the output of the differential receiver depends on the input offset voltage, which typically is determined by random device mismatch and is thus undefined. Consequently, differential receiver outputs could randomly toggle because of noise on the bidirectional bus. Such output signal toggling can lead to noise on supply voltages and undesired increases in power demands.

SUMMARY

Circuits and methods for reducing noise in the power supply of circuits coupled to a bidirectional bus are presented. The circuits and methods are responsive to a control signal generated by a state machine or an alternative control signal generator that defines an idle condition on the bidirectional bus. The control signal is applied to and changes an electrical characteristic within the receiver to generate a voltage offset. The voltage offset prevents unintended voltage transitions in the form of noise on the bidirectional bus from generating signal transitions on an output signal connection of the receiver.

An embodiment of an input/output interface for communicating between devices coupled to each other on a bidirectional bus includes a state machine and a receiver. The state machine operates in multiple clock domains in accordance with both synchronous and asynchronous inputs. The state machine has four states. A first state defines a strobe park condition and each of a second state, a third state, and a fourth state define active strobe conditions. The state machine generates a control signal when the state machine is in the first state. The receiver is connected to the bidirectional bus and is responsive to the control signal. Application of the control signal introduces a voltage offset in the receiver. The voltage offset prevents the receiver from responding to noise on the bidirectional bus.

An embodiment of an improved receiver includes a differential amplifier responsive to a control signal. The improved receiver includes a first branch of the differential amplifier with a reference input connection, a second branch of the differential amplifier with a signal connection with an active element coupled to one of the first branch or the second branch and the control signal. The first branch of the differential amplifier is connected to the second branch of the differential amplifier by a current source. The active element, in response to the control signal, controllably adjusts an electrical characteristic in one of the first branch and the second branch of the differential amplifier.

An embodiment of a method for reducing noise in the power supply of circuits coupled to a bidirectional bus includes the steps of using a state machine to activate a control signal in response to a transition from multiple states defining active strobe conditions to an idle state and applying the control signal to an active circuit element to introduce a voltage offset in a receiver.

The figures and detailed description that follow are not exhaustive. The disclosed embodiments are illustrated and described to enable one of ordinary skill to make and use the circuits and methods for reducing noise in the power supply of circuits coupled to a bidirectional bus. Other embodiments, features and advantages of the circuits and methods will be or will become apparent to those skilled in the art upon examination of the following figures and detailed description. All such additional embodiments, features and advantages are within the scope of the circuits and methods as defined in the accompanying claims.

BRIEF DESCRIPTION OF THE FIGURES

The circuits and methods for reducing noise in the power supply of circuits coupled to a bidirectional bus can be better understood with reference to the following figures. The components within the figures are not necessarily to scale, emphasis instead being placed upon clearly illustrating the principles of controllably introducing an offset voltage in a receiver circuit during bus idle states. Moreover, in the figures, like reference numerals designate corresponding parts throughout the different views.

DETAILED DESCRIPTION

An input/output interface communicates with a DDR memory device. More specifically, the interface reads data from and writes data to the DDR memory device. In an example embodiment, the input/output interface is implemented on an application specific integrated circuit (ASIC).

The input/output interface includes a clock generation and distribution device, which receives a reference clock and generates multiple clock signals. The strobe circuit also includes a preamble detector, a first counter operating with a strobe clock, a second counter operating with an ASIC-generated clock, and a strobe park circuit. The preamble detector receives differential strobe signals from the DDR memory device and generates a preamble signal. The preamble signal initializes the first counter and the strobe park circuit. The first counter operates in accordance with strobe select signals and generates a first count that is applied at a first input of the strobe park circuit. A read data enable signal initializes the second counter. The second counter operates in accordance with ASIC-generated clocks and generates a second count that is applied to a second input of the strobe park circuit. The strobe park circuit operates in accordance with a strobe clock received from the DDR memory device, the first count and the second count. The strobe park circuit controllably replaces the outputs of the differential receivers that receive the differential strobe signals from the DDR memory device with respective non-transitioning signals when data is not being read. When data is being read, the strobe park circuit uses a state machine to determine when to deactivate or park the received strobe signals.

The input/output interface includes a receiver with an active element that is responsive to a strobe park circuit output signal. A state machine in the strobe park circuit identifies multiple states that define a strobe active condition. Data is being communicated from a DDR memory module to the input/output interface when the strobe signal is active. The state machine further generates a state that defines a strobe inactive condition. Data is not being communicated from the DDR memory module to the input/output interface when the strobe signal is inactive. When the strobe signal is inactive, the bus may be idle or data may be being communicated from the input/output interface to the DDR memory module. When the input/output interface is in an idle state, that is when drivers on both ends of the interface are in a high-impedance state, the voltage on the interface collapses to the termination voltage $V_{TT}$ which is $V_{DD}/2$ for DDR3 systems and is equal to $V_{REF}$ on the receiver's reference input. Thus, during the idle state, the receiver inputs ($V_{REF}$ and $V_{TT}$) are at the same voltage level where noise on the bus (and consequently the receiver input) could cause rapid uncontrolled transitions at the receiver output which would couple noise into the power supply of the receiver. The active element is used to generate a voltage offset in the receiver to prevent noise on an input signal conductor from causing undesired signal transitions on output signal conductors of the receiver when the strobe signal is inactive. That is, when the voltage offset is of a magnitude that exceeds the magnitude of random noise on the input signal conductor, the receiver will not generate undesired output signal transitions.

Figure 1:
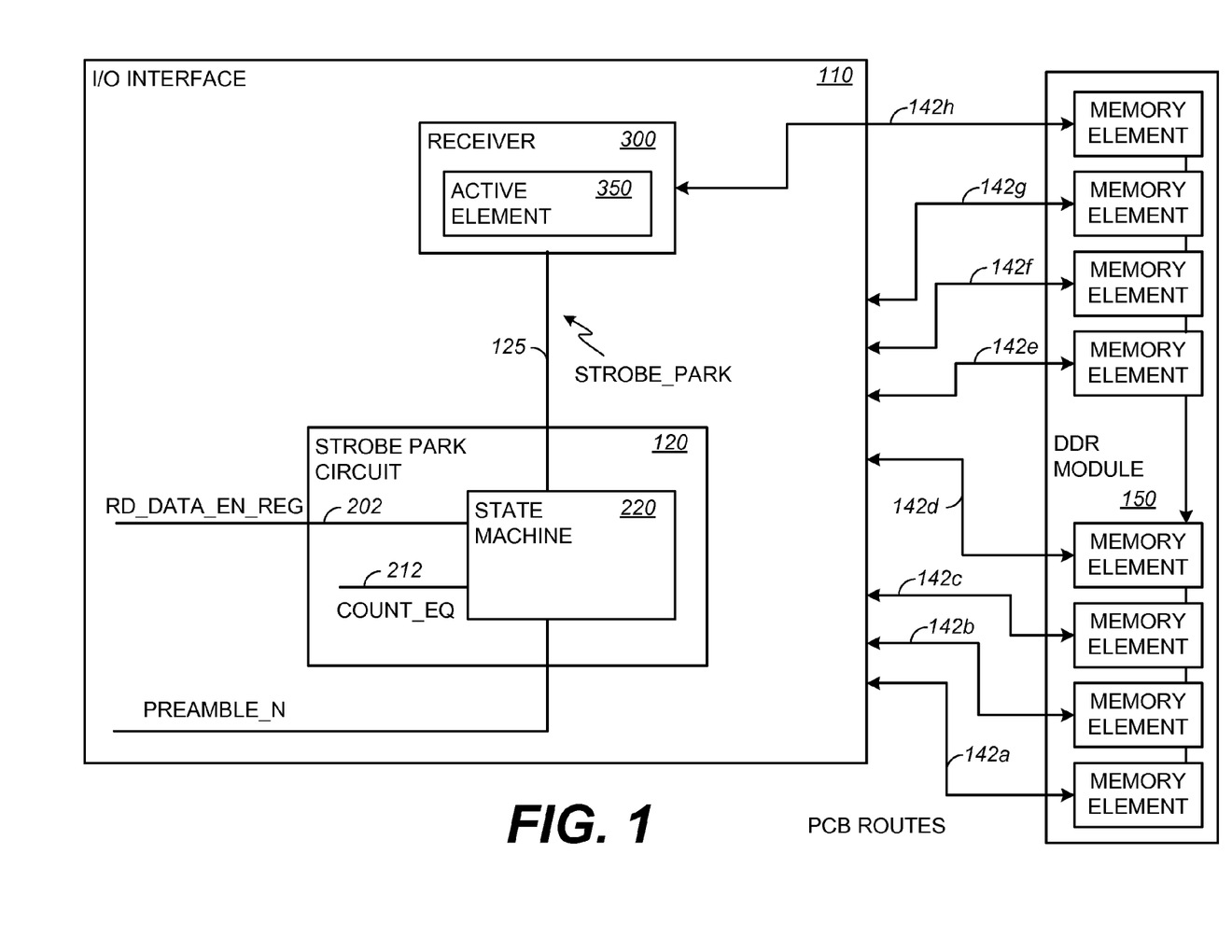
FIG. 1 is a functional block diagram of an embodiment of an input/output interface for communicating with a DDR memory module.

Turning now to the drawings, wherein like reference numerals designate corresponding parts throughout the drawings, reference is made to FIG. 1 which illustrates an embodiment of an input/output interface or I/O interface 110 for communicating with a DDR memory module 150. The I/O interface is responsive to a memory controller (not shown) that may be implemented on the same application specific integrated circuit as the I/O interface. In alternative arrangements, the memory controller may be implemented on a shared printed circuit board or located remotely from and coupled to the I/O interface 110 via one or more connectors (not shown). Source synchronous data transfers include both write operations to and read operations from an identified row and column within an identified memory element of the DDR module 150.

The memory controller (not shown) is any device that includes logic for accessing and managing data stored in the various memory elements of the DDR module 150. In the illustrated embodiment, the I/O interface 110 includes a strobe park circuit 120 that is responsive to a negative true preamble signal (PREAMBLE_N) and a read data enable signal (READ_DATA_EN_REG) received on connection 202. The strobe park circuit 120 functions in accordance with a state machine 220 that receives the negative true preamble signal and the read data enable signal as well as a strobe park circuit generated signal (COUNT_EQ) on connection 212. As will be described in association with the circuit diagram of FIG. 2A and the state diagram of FIG. 2B, the state machine 220 generates a strobe park signal that is communicated on connection 125 to the receiver 300. The receiver 300 includes an active circuit element 350 that in response to the strobe park signal changes an electrical characteristic of a circuit to generate a voltage offset in the receiver 300.

As explained in U.S. Utility patent application Ser. No. 12/557,658, entitled "Interfaces, Circuits, and Methods for Communicating With a Double Data Rate Memory Device" a reference clock is provided at an input to a phase-locked loop element (PLL). The PLL generates a modified reference that has a fixed relation to the phase of the reference clock. The PLL responds to both the frequency and the phase of the reference clock. The modified reference is coupled on clock and data bus to the memory controller, a quarter-cycle delay-locked loop element (QC DLL), a command, address, and clock controller (CAC), a set of source synchronous groups (SSGs) and a clock generation and distribution element. In this way, the PLL provides an ASIC-generated clock signal to each of the memory controller, the QC DLL, the CAC, the SSGs and the clock generation and distribution element. Each of these elements is not shown in FIG. 1.

The CAC operates under the direction of the memory controller and in accordance with one or more ASIC-generated clock signals to issue the necessary commands, addresses, and clock signals via a command, address and clock bus (not shown) to access identified rows and columns in each of the memory elements within the DDR module 150.

The QC DLL generates a compensation code that is propagated to delay elements in the strobe park circuit 120 that enable the strobe output and input signals to be delayed by a quarter clock cycle from the ASIC-generated clock and the source synchronous strobe, respectively. The compensation code that is propagated to the delay elements varies with one or more of process, voltage and temperature. The compensation code is provided to each of the SSGs. Each of the SSGs in the I/O interface 110 is separately coupled to a corresponding memory element in the DDR module 150 via a source synchronous data and clock bus 142. In the illustrated embodiment, the DDR module 150 includes eight commonly addressable memory elements that communicate via a respective SSG coupled to each of a first memory element via bus 142a, a second memory element via bus 142b, and so on through to the eighth memory element via bus 142h. As shown in FIG. 1, each of bus 142a, bus 142b, through to bus 142h traverses a printed circuit board via a distinct route which may have a unique length different from the respective lengths of the remaining source synchronous data and clock busses. Also, each of bus 142a, bus 142b, through to bus 142h is comprised of a differential DQS or strobe signal and multiple single-ended DQ or data signals, typically four or eight DQ signals per bus. The I/O interface 110 includes one receiver 300 for each DQ signal in each bus 142.

Figure 2A:
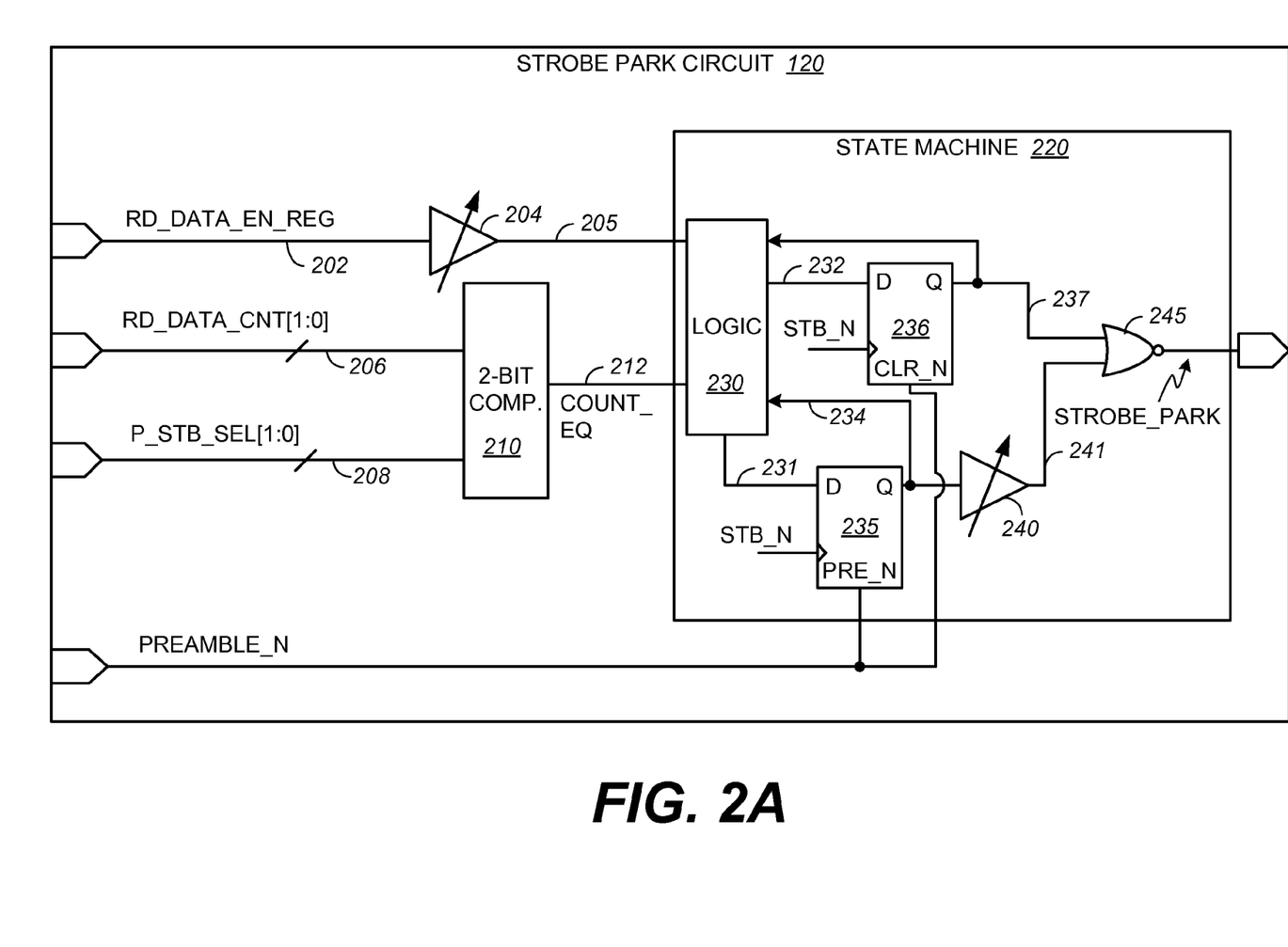
FIG. 2A is a functional block diagram illustrating an embodiment of the strobe park circuit of FIG. 1.

FIG. 2A is a schematic diagram illustrating an embodiment of the strobe park circuit 120 of FIG. 1. The strobe park circuit 120 includes a signal buffer and a state machine 220. The signal buffer receives a RD_DATA_EN_REG signal on connection 202, a RD_DATA_CNT[1:01] signal on bus 206, and a P_STB_SEL[1:01] signal on bus 208.

The signal buffer includes a delay element 204 and a 2-bit comparator 210. The RD_DATA_EN_REG input on connection 202 is coupled to the input of the delay element 204. The delay element 204 adjusts or delays the received data signal in accordance with a control signal from a memory controller (not shown). The adjusted or delayed output signal is coupled on connection 205 to the state machine 220.

The 2-bit comparator 210 is a 2-bit wide count comparator. The RD_DATA_CNT[1:0] input is coupled on bus 206 to a first input port of the 2-bit comparator 210. The P_STB_SEL[1:0] input is coupled on bus 208 to a second input port of the 2-bit comparator 210. When the signals at the two input ports of the 2-bit comparator 210 are the same logic value, the output of the 2-bit comparator 210 propagates a logic "1" on connection 212 (COUNT_EQ signal) to the state machine 220. When the signals at the two input ports of the 2-bit comparator 120 are different logic values, the 2-bit comparator 210 propagates a logic "0" on connection 212 to the state machine 220.

The state machine 220 receives the delayed representation of the RD_DATA_EN_REG signal, the COUNT_EQ signal and the STB_N signal and generates a STROBE_PARK signal. The state machine 220 includes a logic element 230, a first register 235, a second register 236, a delay element 240 and a NOR gate 245. The PREAMBLE_N signal (i.e., the preamble pulse signal) is applied at the asynchronous PRE_N input of the first register 235 and the asynchronous CLR_N input of the second register 236. The PREAMBLE_N signal, as described above, is an asynchronous active-low signal generated by a preamble logic element (not shown) that initializes the state machine 220. The logic element 230 receives the delayed representation of the RD_DATA_EN_REG signal on connection 205 and the COUNT_EQ signal on connection 212 and in accordance with internal logic provides a park next-state "0" data signal on connection to 231 to the data input of the first register 235 and a park next-state "1" data signal on connection 232 to the data input of the second register 236. The output of the second register 236 or the park state "1" signal is coupled to a first input of the NOR gate 245 and to the logic element 230 on connection 237. The output of the first register 235 or the park state "0" signal is coupled to an input of the delay element 240 and to the logic element 230 on connection 234. The delay element 240, in accordance with a control signal from the memory controller (not shown), adjusts or delays the signal on connection 241 before applying the delayed representation of the park state "0" signal to the remaining input of the NOR gate 245. The NOR gate 245 generates the STROBE_PARK signal, which as described above is used to controllably replace the received and buffered strobe inputs on the strobe circuit with fixed logic levels in place of the STB_P and STB_N signals.

Figure 2B:
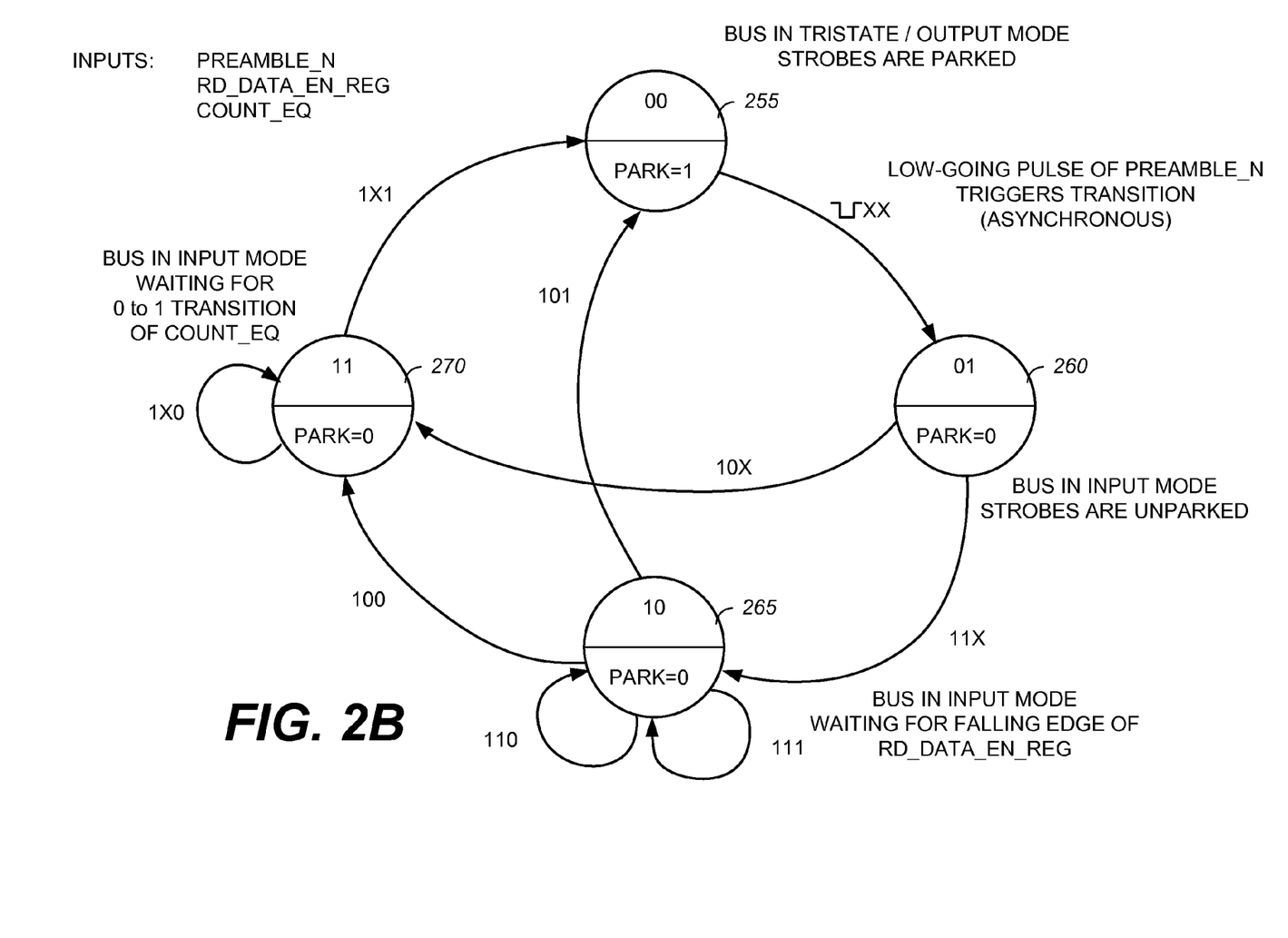
FIG. 2B is a state diagram illustrating operation of the state machine of FIG. 1 and FIG. 2A.

FIG. 2B is a state diagram illustrating operation of the strobe park circuit 120 of FIG. 2A. As indicated in the state diagram of FIG. 2B, the strobe park circuit 120 operates in accordance with three inputs, the PREAMBLE_N signal, the RD_DATA_EN_REG signal and the COUNT_EQ signal. Each of the state transition arrows in the state diagram of FIG. 2B are identified by the three input signals in order. Four states are identified. In a first state 255, designated "00," the data bus is in a idle or output mode and the strobe signals are replaced or "parked." As indicated by the state transition arrow that exits the first state 255, a low-going pulse of the PREAMBLE_N signal causes an asynchronous transition to a second state 260, designated "01," where the data bus is in an input mode and the strobe signals (i.e., STB and STB_N) are enabled or "unparked." After this asynchronous transition, the state machine 220 operates synchronously in the STB_N domain, with the unparked STB_N signal clocking registers 235 and 236 (FIG. 2A) until the state machine 220 finally reaches the first state 255. Once the state machine 220 has entered the second state 260, the state machine 220 remains in the second state 260 until the first rising edge of STB_N. Thereafter, two transitions are possible. When the RD_DATA_EN_REG signal is a logic "1" value, the state machine 220 transitions to a third state 265, designated "10," where the data bus is in input mode and the state machine 220 waits for a falling transition of the RD_DATA_EN_REG signal. Otherwise, when the RD_DATA_EN_REG signal is a logic "0" value, the state machine 220 transitions to a fourth state 270, designated "11," where the data bus is in input mode and the state machine 220 is waiting for a rising or "0" to "1" transition of the COUNT_EQ signal.

In FIG. 2B, certain state transitions are not shown because they represent illegal transitions that cannot occur during normal operation of the state machine 220. These illegal transitions originate from the second state 260, the third state 265, or the fourth state 270 under the condition that the PREAMBLE_N input receives a low-going pulse. Under normal operation of the state machine 220, the PREAMBLE_N input can only be pulsed when a strobe preamble is detected, which can only occur when the state machine is in the first state 255.

Once the state machine 220 has entered the third state 265, the state machine 220 remains in the third state 265 for at least one clock cycle. Thereafter, three transitions are possible. When the COUNT_EQ signal is a logic "1" value and the RD_DATA_EN_REG signal is a logic "0" value, the state machine 220 transitions back to the first state 255, where the strobe signals are replaced or "parked" and the data bus is in an undriven or output mode. When the COUNT_EQ signal is a logic "0" value and the RD_DATA_EN_REG signal is a logic "0" value, the state machine 220 transitions to the fourth state 270. Otherwise, as indicated by the two smaller arrows surrounding the third state 265, if the RD_DATA_EN_REG signal remains at a logic "1" value, the state machine 220 remains in the third state 265.

Once the state machine 220 has entered the fourth state 270, the state machine 220 remains in the fourth state 270 for at least one clock cycle. Thereafter, two transitions are possible. When the state machine 220 detects a rising or "0" to "1" transition of the COUNT_EQ signal, the state machine 220 transitions back to the first state 255 or state "00". This state transition indicates the arrival of the postamble at the strobe input pins. Otherwise, as indicated by the arrow surrounding the fourth state 270, if the COUNT_EQ input remains at a logic "0" level, the state machine 220 remains in the fourth state 270.

The RD_DATA_EN_REG input of state machine 220 transitions synchronously with respect to the RD_CLK input. Therefore, the RD_DATA_EN_REG signal will meet setup and hold requirements with respect to the RD_CLK signal. The RD_DATA_COUNT[1:0] input to the comparator 210 also is synchronous with respect to the RD_CLK signal and will therefore meet setup and hold requirements with respect to the RD_CLK signal. The P_STB_SEL[1:0] input is synchronous with respect to the STB signal and therefore will meet setup and hold requirements with respect to the STB signal. The STB_P clock signal and the STB_N clock signal are complements of each other and therefore have a well-defined synchronous relationship with each other. Specifically, the STB_P and STB_N signals have a phase offset of 180 degrees. Therefore the output of the comparator 210 may be either asynchronous with respect to the STB_N signal in the case where RD_DATA_COUNT[1:0] signal transitions, in which case the COUNT_EQ signal may not meet setup or hold requirements to register 235 and register 236. Also, the output of the comparator 210 may be synchronous with respect to the STB_N signal in the case where P_STB_SEL[1:0] transitions, in which case the COUNT_EQ signal will meet setup and hold requirements to register 235 and register 236. Since there is a possibility of the inputs to register 235 and register 236 not meeting setup or hold requirements, the logic of state machine 220 is designed to adequately respond to this and other logic hazards.

Since the PREAMBLE_N signal is asynchronous with respect to the STB_N signal, the PREAMBLE_N input may not meet setup and hold requirements with respect to the STB_N signal at the PRE_N and CLR_N inputs to register 235 and register 236, respectively. However, the PREAMBLE_N input will only become active when the state machine 220 is in the first state 255, which guarantees that STB_P and STB_N are parked. Since STB_N is parked and therefore not transitioning, the PREAMBLE_N input is guaranteed to meet setup and hold requirements with respect to STB_N as long as the PREAMBLE_N pulse duration is sufficiently small that the PREAMBLE_N input returns to logic "1" before the first rising edge of STB_N arrives at register 235 and register 236.

There is a logic hazard during the transition from the second state 260 to the third state 265, where the register 235 transition from logic "1" to logic "0" at the same time that register 236 transitions from logic "0" to logic "1." Since the STROBE_PARK output is the logic NOR combination of these two signals, the STROBE_PARK output could glitch if the transition at the output of register 235 (logic "1" to logic "0") propagates faster than the output of register 236 (logic "0" to logic "1"). The delay element 240 prevents a glitch from appearing on the STROBE_PARK output during this transition by causing the logic "0" to logic "1" transition of register 235 to propagate to the first input of NOR gate 245 on connection 241 before the logic "1" to logic "0" transition of register 236 propagates to the second input of NOR gate 245 on connection 237.

A logic hazard exists when the state machine 220 is in the second state 260 and transitions to either the third state 265 or the fourth state 270, based on the RD_DATA_EN_REG input. For this transition, the logic for the input of register 236 guarantees a transition from logic "0" to logic "1," so the input to register 236 will meet setup and hold requirements with respect to the STB_N signal. Also for this transition, the logic for the input of register 235 will either cause register 235 to transition from logic "0" to logic "1" or cause register 235 to remain at logic "1," depending on the value of the RD_DATA_EN_REG input signal. Since the RD_DATA_EN_REG input is asynchronous with respect to the STB_N signal, the register 235 may be placed in a metastable state for a short time, this time being much less than a clock cycle, and register 235 will resolve to a logic "0" or a logic "1" for the state transition. Since the output of register 236 always transitions to logic "1" and the output of register 235 transitions to either logic "0" or logic "1," the state machine 220 will transition to either the third state 265 or the fourth state 270. Since both of these states are valid transitions and the STB_PARK output is unaffected, the operation of the state machine 220 responds adequately in all cases to this logic hazard.

The state machine 220 is designed to respond adequately to inputs (e.g., the RD_DATA_EN_REG signal) in the RD_CLK domain and strobe inputs in the strobe (e.g., STB and STB_N) domain. However, there are constraints on the timing relationship between these inputs. If the strobe preamble input arrives before the RD_DATA_EN_REG input, the state machine 220 will fail to transition from the first state 255 to the second state 260 during the strobe preamble, thus causing the state machine 220 to be in an invalid state. This is referred to as the early timing constraint. If two read data bursts occur with minimal temporal separation (one clock cycle) and the strobe preamble input arrives several clock cycles subsequent to the arrival of the RD_DATA_EN_REG input, then the rising transition of the RD_DATA_EN_REG signal for the second burst may arrive at the state machine 220 during the second state 260 and cause an incorrect transition from the second state 260 to the third state 265, instead of a correct transition from the second state 260 to the fourth state 270. This is referred to as the late timing constraint. To restate, the early timing constraint requires that the RD_DATA_EN_REG input must arrive at the state machine 220 before the PREAMBLE_N pulse input at the state machine 220. The late timing constraint requires that the state machine 220 transitions into the third state 265 for the current read burst before the RD_DATA_EN_REG signal for the next read burst arrives at the state machine 220. In practice, this gives a timing window of greater than 2 clock cycles width to define the timing relationship between the RD_DATA_EN_REG and PREAMBLE_N inputs to the state machine 220. The ideal (center point) of the timing window is when the PREAMBLE_N pulse input arrives approximately 1 clock cycle after the RD_DATA_EN_REG input transitions from logic "0" to logic "1".

For example, upon encountering an early input of a data signal, the state machine 220 will, in accordance with the state diagram of FIG. 2B, start at the first state 255 or state "00." Upon receipt of the low-going pulse of the PREAMBLE_N signal, the state machine 220 transitions to the second state 260 or state "01," where the state machine 220 remains until a rising edge of the STB_N signal is detected. Upon detection of the rising edge of the STB_N signal, the state machine 220 transitions to the third state 265 or state "10," where the state machine 220 remains until receipt of the "0" to "1" transition of the COUNT_EQ signal. Thereafter, the state machine 220 transitions back to the first state 255 or state "00."

The COUNT_EQ and RD_DATA_EN_REG signals define four possibilities for metastable logic hazards when the state machine 220 transitions from the third state 265 to either the third state 265, the fourth state 270, or the first state 255. In a first combination, the COUNT_EQ signal is metastable and the RD_DATA_EN_REG signal is a logic "1" value. In a second combination, the RD_DATA_EN_REG signal is metastable and the COUNT_EQ signal is a logic "0" value. In a third combination, the COUNT_EQ signal is metastable and the RD_DATA_EN_REG signal is a logic "0" value. In a fourth combination, the RD_DATA_EN_REG signal is metastable and the COUNT_EQ signal is a logic "1" value. The first combination is rendered stable as indicated by the short arrows surrounding the third state 265 that indicate that either data value of COUNT_EQ when the RD_DATA_EN_REG signal is a logic "1" value results in the state machine 220 maintaining the third state 265. The second combination is rendered stable as indicated by the transition arrow labeled "100" that indicates a transition from the third state 265 to the fourth state 270 and the leftmost arrow in the vicinity of the third state 265 that shows that a "110" combination of the PREAMBLE_N, RD_DATA_EN_REG, and COUNT_EQ signals results in the state machine 220 maintaining the third state 265, either transition being a valid state transition. The third combination cannot occur. When the RD_DATA_EN_REG signal is a logic "0" value, the RD_DATA_CNT[1:0] input to the comparator 210 is non-transitioning, so the COUNT_EQ signal updates synchronously on STB_P signal rising transitions. The fourth combination can occur, but it is a violation of the "early" timing constraint. That is, where the strobe signals arrive too early and the falling edge of the RD_DATA_EN_REG signal misses the setup of the last STB_N rising transition.

Figure 3:
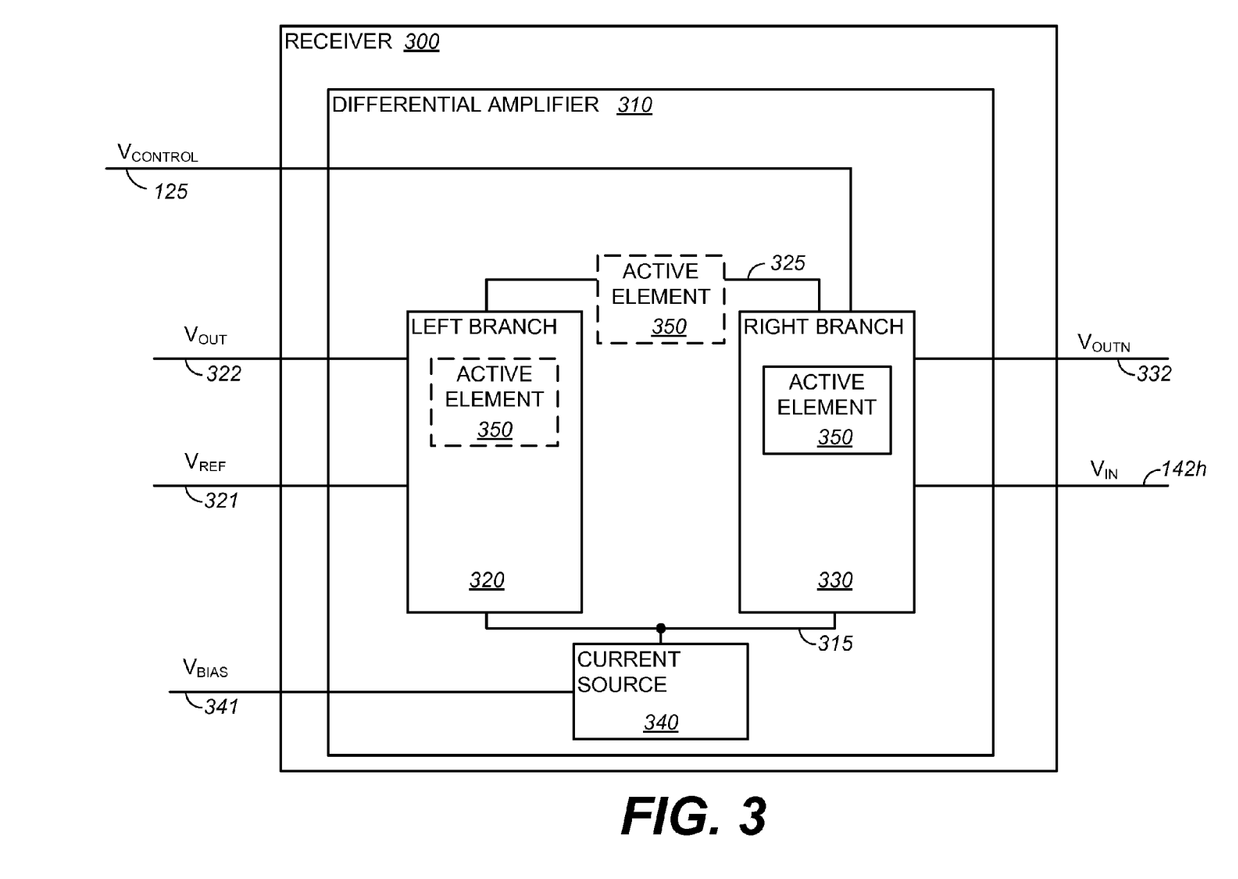
FIG. 3 is a functional block diagram illustrating an embodiment of the receiver of FIG. 1.

FIG. 3 is a functional block diagram illustrating an embodiment of the receiver 300 of FIG. 1. In the illustrated embodiment, the receiver 300 includes a differential amplifier 310. A first or left branch 320 of the differential amplifier 310 is arranged to receive a reference signal $V_{REF}$ on connection 321 and provide a true output signal $V_{OUT}$ on connection 322. A second or right branch 330 of the differential amplifier 310 is arranged to receive an input signal $V_{IN}$ on connection 142$h$ and provide a complimentary output signal $V_{OUTN}$ on connection 332. The left branch 320 of the differential amplifier 310 is coupled to the right branch 330 of the differential amplifier 310 by connection 325. In addition, the left branch 320 of the differential amplifier 310 is coupled to the right branch 330 of the differential amplifier 310 and to current source 340 by connection 315. The current source is controlled by a signal $V_{BIAS}$ applied to the current source 340 on connection 341. As further illustrated in FIG. 3, the differential amplifier 310 receives a control signal (e.g., the Strobe_Park signal of FIG. 1) on connection 125. The control signal is applied to the active element 350, which is located in or in parallel with circuit elements in one of the right branch 330, the left branch 320, or alternatively along the connection 325 that couples the left branch 320 to the right branch 330 of the differential amplifier 310.

When the active element 350 is in or coupled to the right branch 330 of the differential amplifier 310 as shown in FIG. 3, the control signal is provided by connection 125 to the right branch 330 and more specifically the active element 350. When the active element 350 is coupled to the left branch 320 of the differential amplifier 310 (not shown), the control signal on connection 125 is coupled to the left branch 320 of the differential amplifier 310. In this alternative arrangement, the control signal on connection 125 is not necessarily coupled to the right branch 330 of the differential amplifier 310. Such an embodiment is illustrated in FIG. 7 and described in the related portion of the detailed description. Alternatively, as will be described in association with the embodiment shown in FIG. 6, the active element 350 may be inserted along connection 325, which connects the left branch 320 to the right branch 330 of the differential amplifier 310. When the active element 350 is inserted along connection 325 between the left branch 320 and the right branch 330 of the differential amplifier 310 (not shown), the control signal on connection 125 is coupled to the active element 350, which is not in either the left branch 320 or the right branch 330 of the differential amplifier 310.

When the control signal is disabled (i.e., the strobe is active) and the active element 350 is not coupled to right branch of the differential amplifier 310, as illustrated in FIG. 3, the left branch 320 and right branch 330 of differential amplifier 310 are matched and there is no offset voltage in differential amplifier 310. In operation, that is, when the control signal is enabled (i.e., the strobe is inactive) and the active element 350 is coupled to the right branch 330 of the differential amplifier 310, as illustrated in FIG. 3, the differential amplifier 310 generates an offset voltage that prevents the differential amplifier 310 from generating undesired output signal transitions in the true and complimentary output signals ($V_{OUT}$ and $V_{OUTN}$) in response to noise on connection 142$h$ when $V_{IN}$ is equal to $V_{REF}$.

Figure 4:
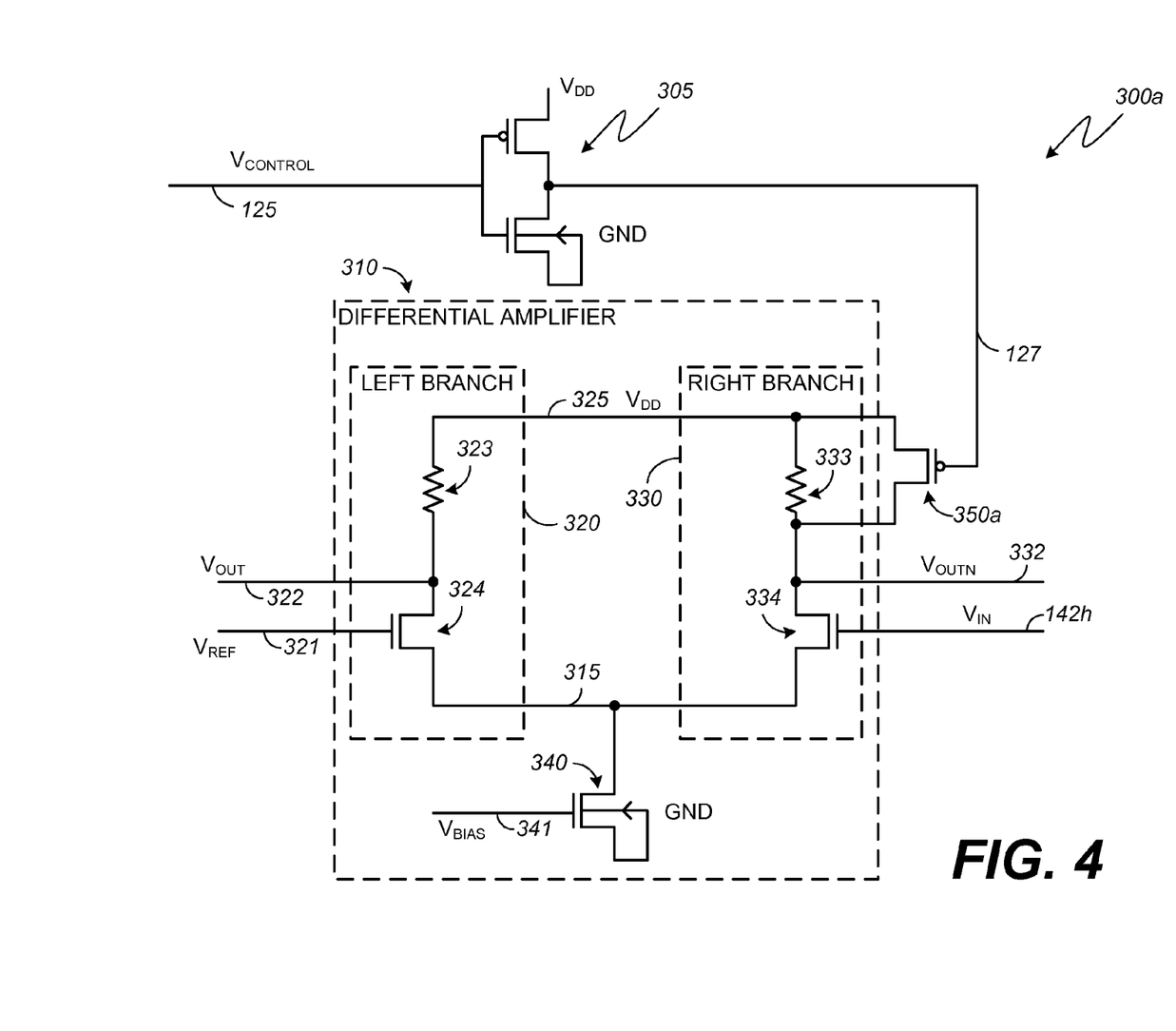
FIG. 4 is a schematic diagram of an embodiment of the receiver of FIG. 3.

FIG. 4 is a schematic diagram of an embodiment of the receiver 300 of FIG. 3. The receiver 300$a$ shows circuit elements in an example embodiment of the left branch 320 and the right branch 330 of the differential amplifier 310. As shown in FIG. 4, the left branch 320 includes a resistor 323 connected in series with a n-channel field-effect transistor (NFET) 324. The connection 322 is coupled to the left branch 320 at a node between the resistor 323 and the source of the NFET 324. The gate of the NFET 324 receives the signal $V_{REF}$ on connection 321. The drain of the NFET 324 is coupled to the source of an NFET 340 by connection 315. The gate of the NFET 340 receives the VBIAS signal on connection 341.

The right branch 330 includes a resistor 333 connected in series with NFET 334. The connection 332 is coupled to the right branch 330 at a node between the resistor 333 and the source of the NFET 334. The gate of the NFET 334 receives the signal $V_{IN}$ on connection 142h. The drain of the NFET 334 is coupled to the source of an NFET 340 by connection 315.

As further illustrated in FIG. 4, the receiver 300a includes an inverter 305 along connection 125. The inverter 305 has an input along connection 125 and an output along connection 127. The inverter 305 changes the logical sense of the control signal on connection 125 and provides the inverted or modified control signal on connection 127 to the active element 350a. In the illustrated embodiment, the active element 350a is a p-channel FET (PFET) coupled in parallel with the resistor 333 of the right branch 330 of the differential amplifier 310. More specifically, the inverter 305 ensures that the control signal reaches the gate of PFET 350a, which is coupled in parallel with the resistor 333, in an active low sense. When the control signal is enabled, the parallel arrangement of the resistor 333 and the PFET 350a reduce the resistance in the right branch 330 of the differential amplifier 310, thereby generating an offset voltage in the receiver 300a that prevents the differential amplifier 310 from generating undesired output signal transitions in the true and complimentary output signals ($V_{OUT}$ and $V_{OUTN}$) in response to noise on connection 142h.

Figure 5:
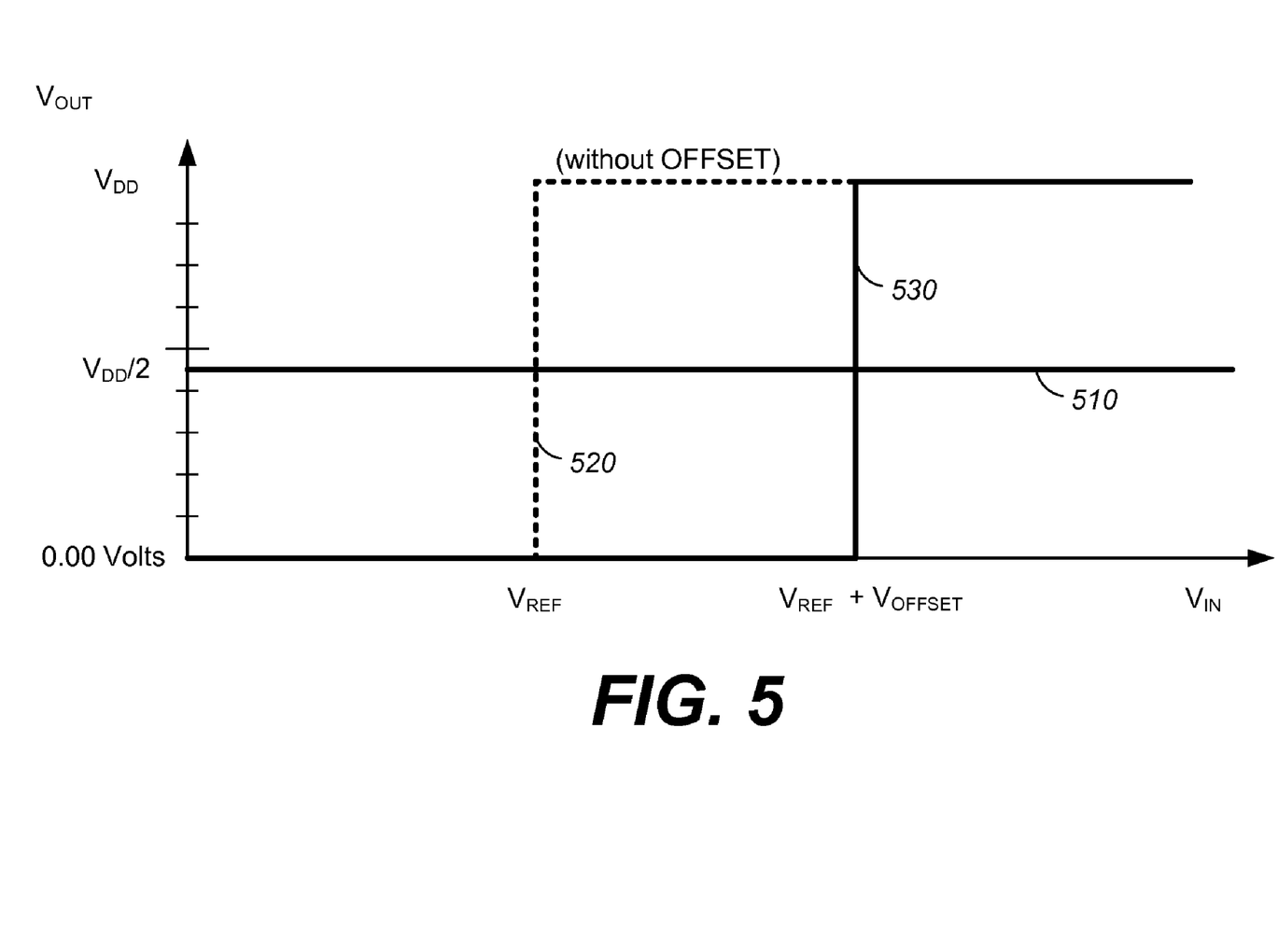
FIG. 5 is a plot that illustrates the effect on an output signal $V_{OUT}$ with and without the offset voltage generated in the receiver of FIG. 3.

FIG. 5 is a plot that illustrates the effect on an output signal $V_{OUT}$ with and without the offset voltage generated in the differential amplifier 310 (FIG. 4) of the receiver 300 (FIG. 3). The plot illustrated in FIG. 5 shows a voltage, $V_{IN}$, along the abscissa and a voltage, $V_{OUT}$, along the ordinate. A termination voltage (i.e., VDD/2) is represented by the trace 510. The output voltage, $V_{OUT}$, of the receiver 300 without the offset voltage applied (i.e., $V_{REF}$ only) is represented by trace 520. The output voltage, $V_{OUT}$, of the receiver 300 with the offset voltage applied is represented by trace 530. As illustrated in FIG. 5, when the offset is not applied the output of the receiver 300 transitions from GND, or logic "0" level, to $V_{DD}$, or logic "1" level when $V_{IN}$ approximates $V_{REF}$. As further illustrated in FIG. 5, when the offset is applied, the output of the receiver 300 transitions from GND, or logic "0" level, to $V_{DD}$, or logic "1" level, when $V_{IN}$ approximates $V_{REF}+V_{OFFSET}$.

Figure 6:
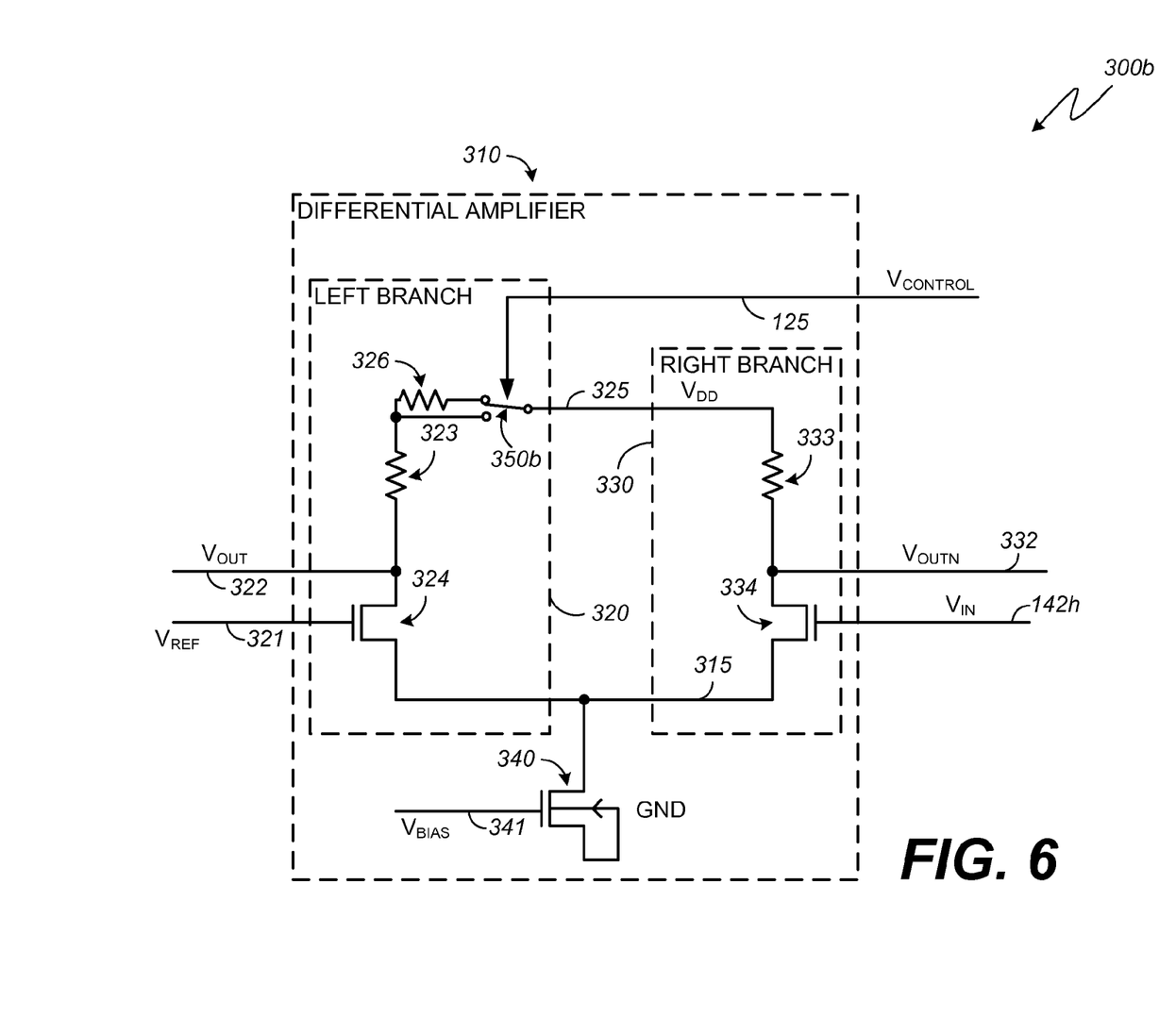
FIG. 6 is a schematic diagram illustrating an alternative embodiment of the receiver of FIG. 3.
Figure 7:
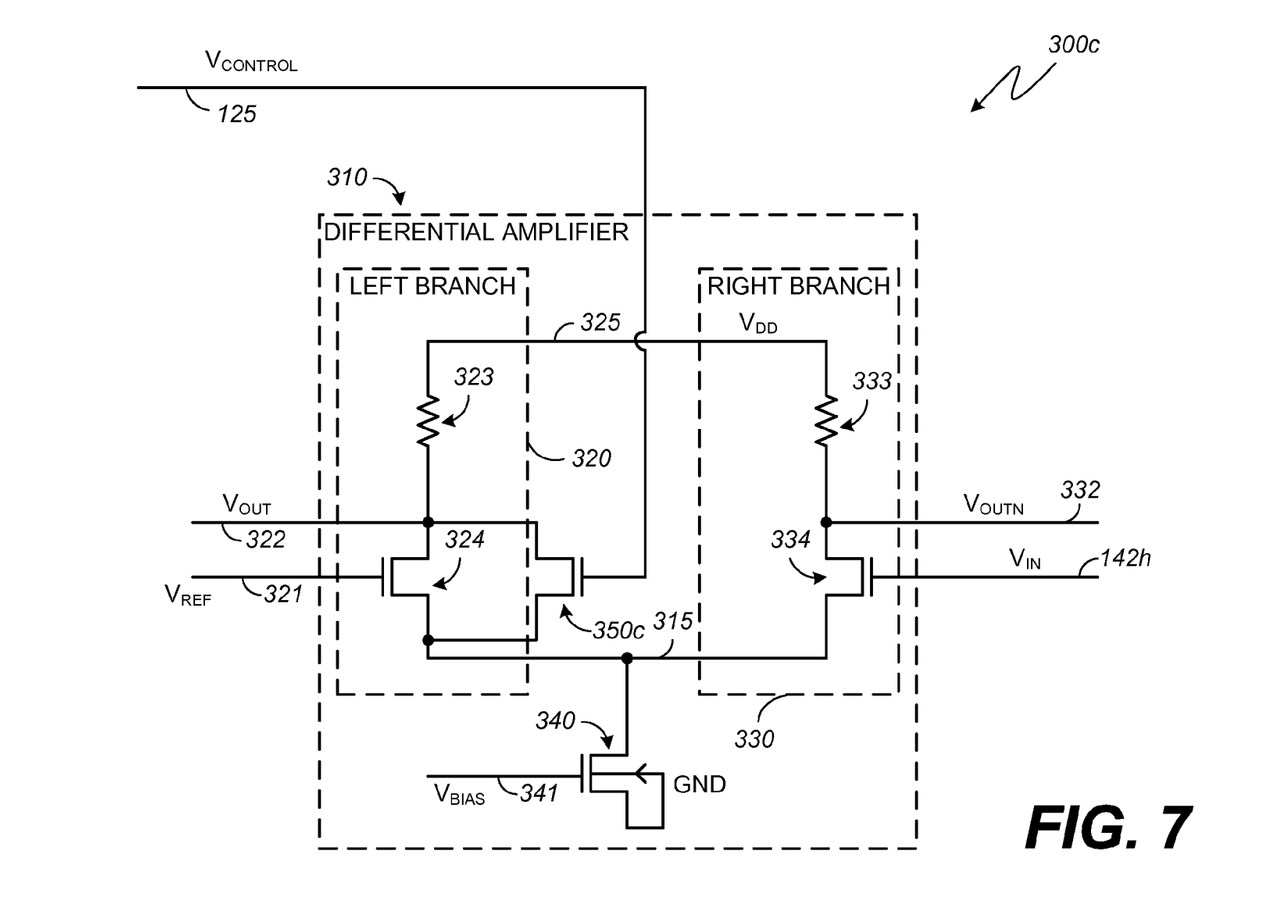
FIG. 7 is a schematic diagram illustrating another alternative embodiment of the receiver of FIG. 3.

FIG. 6 is a schematic diagram illustrating an alternative embodiment of the receiver 300 of FIG. 3. The receiver 300b shows circuit elements in an example embodiment of the left branch 320 and the right branch 330 of the differential amplifier 310. As shown in FIG. 6, the left branch 320 includes a resistor 323 connected in series with a n-channel field-effect transistor (NFET) 324. The connection 322 is coupled to the left branch 320 at a node between the resistor 323 and the source of the NFET 324. The gate of the NFET 324 receives the signal $V_{REF}$ on connection 321. The drain of the NFET 324 is coupled to the source of an NFET 340 by connection 315. The gate of the NFET 340 receives the $V_{BIAS}$ signal on connection 341. A backbias connection of the NFET 340 is connected to electrical ground.

The right branch 330 includes a resistor 333 connected in series with NFET 334. The connection 332 is coupled to the right branch 330 at a node between the resistor 333 and the source of the NFET 334. The gate of the NFET 334 receives the signal $V_{IN}$ on connection 142h. The drain of the NFET 334 is coupled to the source of an NFET 340 by connection 315.

As further illustrated in FIG. 6, the left branch 320 of the receiver 300b includes a resistor 326 and a switch 350b. The switch 350b is inserted along connection 325, which couples the left branch 320 to the right branch 330 of the differential amplifier 310 and provides a voltage, $V_{DD}$ to both the left branch 320 and the right branch 330 of the differential amplifier 310. When enabled, the control signal on connection 125 pulls the switch 350b to the position shown in FIG. 6, which couples the resistor 326 in series with the resistor 323. This increases the resistance in the left branch 320 with respect to the resistance in the right branch 330 of the differential amplifier 310, thereby generating an offset voltage in the receiver 300b that prevents the differential amplifier 310 from generating undesired output signal transitions in the true and complimentary output signals ($V_{OUT}$ and $V_{OUTN}$) in response to noise on connection 142h.

FIG. 7 is a schematic diagram illustrating another alternative embodiment of the receiver 300 of FIG. 3. The receiver 300c shows circuit elements in an example embodiment of the left branch 320 and the right branch 330 of the differential amplifier 310. As shown in FIG. 7, the left branch 320 includes a resistor 323 connected in series with NFET 324. The connection 322 is coupled to the left branch 320 at a node between the resistor 323 and the source of the NFET 324. The gate of the NFET 324 receives the signal $V_{REF}$ on connection 321. The drain of the NFET 324 is coupled to the source of an NFET 340 by connection 315. The gate of the NFET 340 receives the $V_{BIAS}$ signal on connection 341. A backbias connection of the NFET 340 is connected to electrical ground.

The right branch 330 includes a resistor 333 connected in series with NFET 334. The connection 332 is coupled to the right branch 330 at a node between the resistor 333 and the source of the NFET 334. The gate of the NFET 334 receives the signal $V_{IN}$ on connection 142h. The drain of the NFET 334 is coupled to the source of an NFET 340 by connection 315.

As further illustrated in FIG. 7, the $V_{CONTROL}$ signal on connection 125 is coupled to the gate of NFET 350c. The NFET 350c is coupled in parallel with the NFET 324 in the left branch 320 of the differential amplifier 310. When enabled, the control signal on connection 125 reduces the effective resistance of the NFET 350c. This decrease in the resistance in the left branch 320 with respect to the resistance in the right branch 330 of the differential amplifier 310, generates an offset voltage in the receiver 300c that prevents the differential amplifier 310 from generating undesired output signal transitions in the true and complimentary output signals ($V_{OUT}$ and $V_{OUTN}$) in response to noise on connection 142h.

Figure 8:
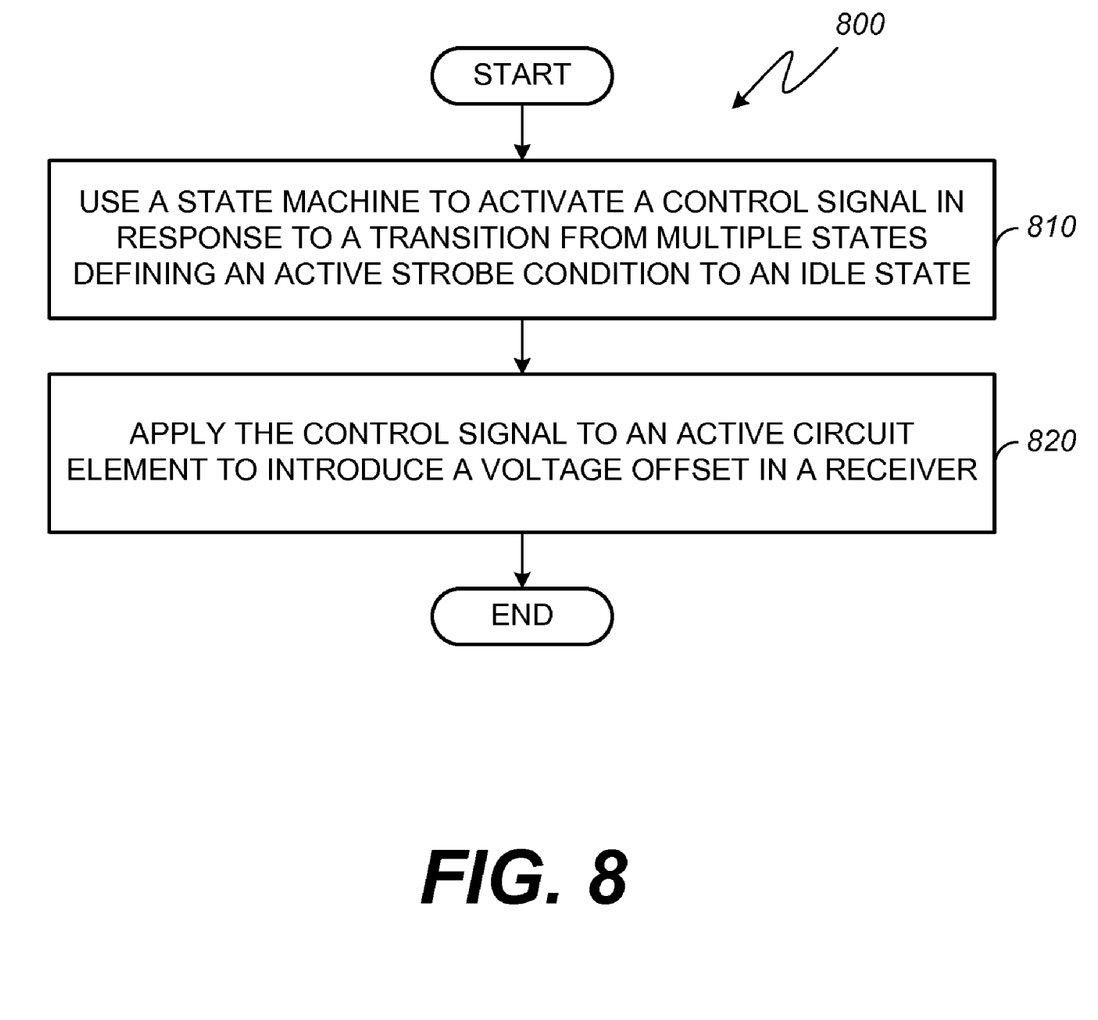
FIG. 8 is a flow diagram illustrating an embodiment of a method for reducing noise on a bidirectional bus.

FIG. 8 is a flow diagram illustrating an embodiment of a method 800 for reducing noise in the power supply of circuits coupled to a bidirectional bus such as the bidirectional bus 142h of FIG. 1. The method 800 begins with block 810, where a state machine is used to activate a control signal in response to a transition from multiple states defining an active strobe condition to an idle state that defines an inactive strobe condition. Such a state machine was illustrated in FIGS. 2A and 2B and described in the related portions of the detailed description. When the state machine 220, indicates that the strobe signal is inactive, the method 800 continues with block 820, where the control signal is applied to an active circuit element to introduce a voltage offset in a receiver. As indicated above, the voltage offset in the receiver can be generated in a number of different ways. For example, as shown in FIG. 4, the control signal can be applied to an active circuit element arranged in parallel with a resistor or resistive element in a branch of a differential amplifier within the receiver. By way of further example, the control signal can be applied to a switch that controllably couples a first resistor or other resistive element in series with a second resistor or resistive element in a branch of a differential amplifier within the receiver. In still another example, the control signal can be applied to the gate of a transistor coupled in parallel with a transistor in a branch of a differential amplifier within the receiver.

While various example embodiments of the circuits and methods for reducing noise on a bidirectional bus have been described, it will be apparent to those of ordinary skill in the art that many more embodiments and implementations are possible that are within the scope of this disclosure. For example, alternative embodiments of the receiver could be PFET based with the current source connected between VDD and the PFET inputs and with load resistors connected between the input PFETs and GND. Additional alternatives could be arranged with active loads in the differential amplifiers instead of the passive resistors. Accordingly, the described circuits and methods are not to be restricted or otherwise limited except in light of the attached claims and their equivalents.

What is claimed is:

1. An input/output interface for communicating with a double data rate (DDR) memory device, the interface comprising:
    a state machine operating in multiple clock domains in accordance with both synchronous and asynchronous inputs, the state machine comprising a first state defining a strobe park condition and each of a second state, a third state and a fourth state defining active strobe conditions, the state machine generating a control signal responsive to the first state; and
    a receiver coupled to a bidirectional bus and arranged to receive the control signal at an active circuit element coupled in parallel with an input transistor of a differential amplifier, wherein application of the control signal introduces a voltage offset in the receiver.

2. The input/output interface of claim 1, wherein the active circuit element comprises a switch coupled in series with a resistor.

3. The input/output interface of claim 1, wherein the active circuit element comprises a metal-oxide semiconductor field-effect transistor.

4. The input/output interface of claim 3, wherein the metal-oxide semiconductor field-effect transistor is arranged in parallel with a resistor and the resistor is coupled in a branch of a differential amplifier.

5. A receiver circuit, comprising;
    a first branch of a differential amplifier including a reference input connection;
    a second branch of the differential amplifier coupled to the first branch of the differential amplifier by a current source, the second branch of the differential amplifier including a signal connection;
    an active element coupled in parallel with a resistor to one of the first branch of the differential amplifier and the second branch of the differential amplifier, the active element receiving a control signal that when applied to the active element adjusts an electrical characteristic in one of the first branch and the second branch of the differential amplifier.

6. The receiver circuit of claim 5, wherein the resistor is in series with the first branch of the differential amplifier.

7. The receiver circuit of claim 5, wherein the resistor is in series with the second branch of the differential amplifier.

8. The receiver circuit of claim 5, wherein the active element is a metal-oxide semiconductor field-effect transistor.

9. The receiver circuit of claim 5, wherein the active element is coupled in parallel with an input transistor.

10. The receiver circuit of claim 9, wherein the input transistor is in the first branch of the differential amplifier.

11. The receiver circuit of claim 9, wherein the input transistor is in the second branch of the differential amplifier.

12. The receiver circuit of claim 5, wherein the active element is coupled in series with a resistor in one of the first branch or the second branch of the differential amplifier.

13. A method for reducing noise in the power supply of circuits coupled to a bidirectional bus, the method comprising:
    using a state machine to activate a control signal in response to a transition from multiple states defining active strobe conditions to an idle state defining an inactive strobe condition; and
    applying the control signal to an active circuit element arranged in parallel with an input transistor to introduce a voltage offset in a receiver.

14. The method of claim 13, wherein using a state machine to activate a control signal further comprises monitoring a read data enable signal, a first counter responsive to a first-clock domain, a second counter responsive to a host-clock domain, and determining when a first counter output is equal to a second counter output.

15. The method of claim 13, wherein applying the control signal to an active circuit element comprises applying the control signal to the gate of a metal-oxide semiconductor field effect transistor.

16. The method of claim 13, wherein applying the control signal to an active circuit element comprises applying the control signal to a switch arranged in series with a branch of a differential amplifier.

* * * * *